(12) United States Patent
Sakano et al.

(10) Patent No.: US 9,204,554 B2
(45) Date of Patent: Dec. 1, 2015

(54) METHOD FOR MANUFACTURING DISPLAY DEVICE

(71) Applicant: Kabushiki Kaisha Toshiba, Minato-ku (JP)

(72) Inventors: Tatsunori Sakano, Tokyo (JP); Kentaro Miura, Kanagawa-ken (JP); Nobuyoshi Saito, Kanagawa-ken (JP); Shintaro Nakano, Kanagawa-ken (JP); Tomomasa Ueda, Kanagawa-ken (JP); Hajime Yamaguchi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 64 days.

(21) Appl. No.: 13/944,266

(22) Filed: Jul. 17, 2013

(65) Prior Publication Data

US 2013/0302534 A1    Nov. 14, 2013

Related U.S. Application Data

(62) Division of application No. 13/483,672, filed on May 30, 2012, now Pat. No. 8,513,040.

(30) Foreign Application Priority Data

Sep. 27, 2011    (JP) .................................. 2011-211661

(51) Int. Cl.
*H01L 21/00*    (2006.01)
*H05K 3/10*    (2006.01)
(Continued)

(52) U.S. Cl.
CPC ................ *H05K 3/10* (2013.01); *G02F 1/1362* (2013.01); *G02F 1/133305* (2013.01); *H01L 27/1266* (2013.01); *H01L 2227/326* (2013.01)

(58) Field of Classification Search
CPC ...................... H01L 27/1266; H01L 2227/326
USPC ............................................................ 438/46
See application file for complete search history.

(56) References Cited

U.S. PATENT DOCUMENTS 7,439,111 B2    10/2008   Ohtani et al.
7,452,790 B2    11/2008   Park et al.
(Continued)

FOREIGN PATENT DOCUMENTS

| CN | 101272643 A | 9/2008 |
| JP | 2007-512568 | 5/2007 |
| TW | 200915546 A | 4/2009 |

OTHER PUBLICATIONS

Combined Office Action and Search Report issued on Jan. 22, 2015 in Taiwanese Patent Application No. 101119538 with English translation.

(Continued)

*Primary Examiner* — Yu-Hsi D Sun
*Assistant Examiner* — Ankush Singal
(74) *Attorney, Agent, or Firm* — Oblon, McClelland, Maier & Neustadt, L.L.P

(57) ABSTRACT

According to one embodiment, a method is disclosed for manufacturing a display device. A film material layer is formed on a support substrate. A first heating process for the film material layer at a first temperature to form a film layer and a second heating process for a second region surrounding a first region at a second temperature higher than the first temperature are performed. The first region is provided in a central part of the film layer. A display layer is formed in the first region and a peripheral circuit section is formed at least in a part of the second region. A third heating process is performed for at least a part of the film layer at a third temperature higher than the second temperature. In addition, the film layer is peeled off from the support substrate.

4 Claims, 7 Drawing Sheets

(51) Int. Cl.
*H01L 27/12* (2006.01)
*G02F 1/1333* (2006.01)
*G02F 1/1362* (2006.01)

(56) References Cited

U.S. PATENT DOCUMENTS

| | | | |
|---|---|---|---|
| 7,691,656 | B2 | 4/2010 | Bader et al. |
| 7,884,367 | B2 | 2/2011 | Takafuji et al. |
| 7,968,388 | B2 | 6/2011 | Komatsu |
| 8,338,204 | B2 | 12/2012 | Kim et al. |
| 2001/0040645 | A1* | 11/2001 | Yamazaki ................ 349/42 |
| 2001/0049070 | A1 | 12/2001 | Takamori et al. |
| 2002/0102758 | A1* | 8/2002 | Yonehara et al. ........... 438/30 |
| 2003/0194484 | A1 | 10/2003 | Yamazaki et al. |
| 2004/0048455 | A1 | 3/2004 | Karasawa et al. |
| 2004/0169474 | A1 | 9/2004 | Hampden-Smith et al. |
| 2006/0030085 | A1 | 2/2006 | Park et al. |
| 2007/0224547 | A1 | 9/2007 | Kido |
| 2008/0157660 | A1 | 7/2008 | Ohyama et al. |
| 2009/0029525 | A1* | 1/2009 | Ohnuma ................ 438/458 |
| 2009/0291518 | A1 | 11/2009 | Kim et al. |
| 2010/0068898 | A1* | 3/2010 | Moffatt et al. ............ 438/799 |
| 2010/0219415 | A1 | 9/2010 | Park et al. |
| 2011/0070370 | A1 | 3/2011 | Teo et al. |
| 2011/0108943 | A1 | 5/2011 | Dennard et al. |
| 2011/0151618 | A1 | 6/2011 | Yamazaki et al. |
| 2011/0207321 | A1 | 8/2011 | Fujiwara et al. |
| 2011/0229831 | A1 | 9/2011 | Kido |
| 2012/0040479 | A1 | 2/2012 | Kim et al. |

OTHER PUBLICATIONS

Japanese Office Action issued Oct. 3, 2014, in Japan Patent Application No. 2011-211661 (with English translation).

* cited by examiner

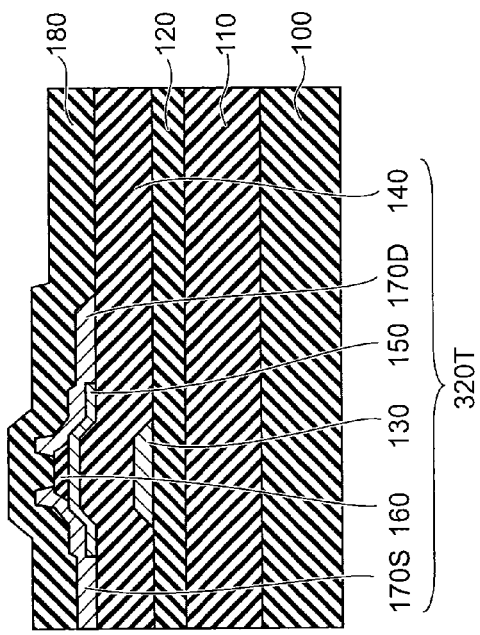
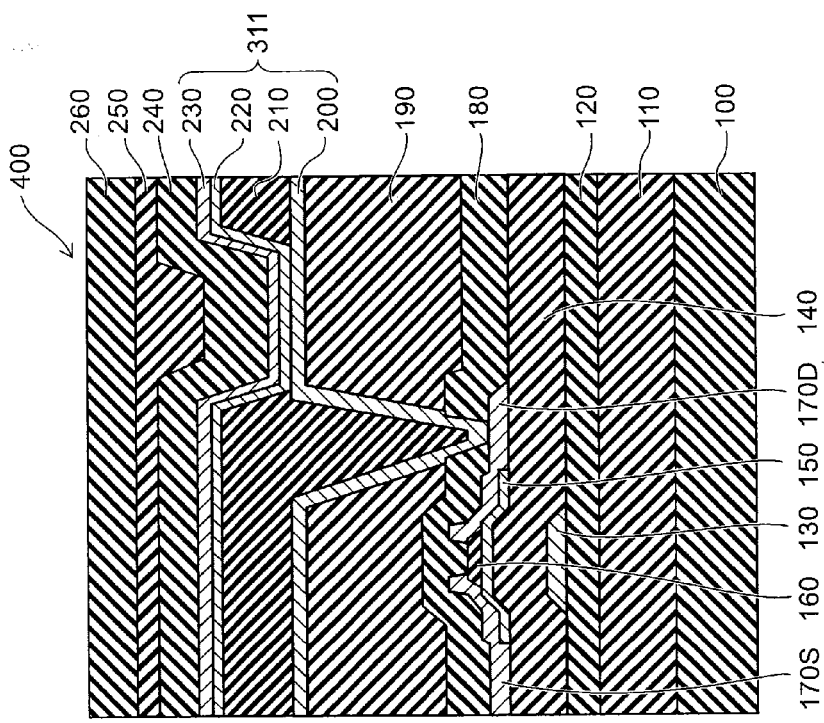
FIG. 2B
FIG. 2A

METHOD FOR MANUFACTURING DISPLAY DEVICE

CROSS-REFERENCE TO RELATED APPLICATIONS

This application is a divisional of U.S. application Ser. No. 13/483,672 filed May 30, 2012 and is based upon and claims the benefit of priority from the prior Japanese Patent Application No. 2011-211661, filed on Sep. 27, 2011; the entire contents of each of which are incorporated herein by reference.

FIELD

Embodiments described herein relate generally to a method for manufacturing a display device.

BACKGROUND

In recent years, in general, in a display device using a display element such as a liquid crystal display element, an electroluminescent element (EL element), or the like, a high level of demand has been placed for a long-term reliability, a high degree of freedom of shape, an availability of a curve-face display, etc. in addition to weight saving and upsizing. Therefore, as a substrate used for the display device, a film layer such as transparent plastic, etc. is gaining attention in place of a glass substrate which is heavy, fragile, and difficult to increase the area. Although it is also possible to form a display using plastic based on a role to role process, in consideration of cost, there is a method for forming a display device in which a film layer is provided on a support substrate such as a glass substrate, and a circuit and a display layer are formed on the film layer, and then, the film layer is peeled off from the support substrate.

BRIEF DESCRIPTION OF THE DRAWINGS

FIG. 2A and FIG. 2B are partial cross sectional views of the display device according to the embodiment;

DETAILED DESCRIPTION

Figure 1:
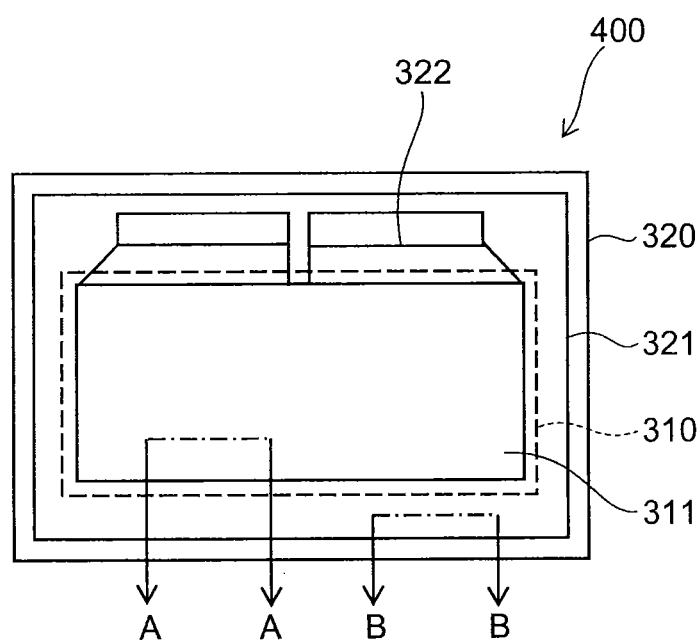
FIG. 1 is an upper face view of a display device according to an embodiment.

According to one embodiment, a method is disclosed for manufacturing a display device. The method can include a process for forming a film material layer on a support substrate. The method can include a first heating process for heating the film material layer at a first temperature to form a film layer. The method can include a second heating process for heating a second region surrounding a first region at a second temperature higher than the first temperature. The first region is provided in a central part of the film layer. The method can include a process for forming a display layer in a part of the first region and forming a peripheral circuit section at least in a part of the second region. The method can include a third heating process for heating at least a part of the film layer other than a range in which the display layer is formed at a third temperature higher than the second temperature. In addition, the method can include a process for peeling off the film layer from the support substrate.

An embodiment provides a manufacturing method for a display device in which a film layer is difficult to be peeled off from a support substrate at the time of forming a circuit and a display layer, and the film layer is easy to be peeled off from the support substrate after the circuit and the display layer are formed.

Various embodiments will be described hereinafter with reference to the accompanying drawings.

The drawings are schematic or conceptual; and the relationships between the thicknesses and widths of portions, the proportions of sizes among portions, etc. are not necessarily the same as the actual values thereof. Further, the dimensions and the proportions may be illustrated differently among the drawings, even for identical portions.

In the specifications and the drawings of the application, components similar to those described in regard to a drawing thereinabove are marked with like reference numerals, and a detailed description is omitted as appropriate.

FIG. 1 shows an upper face view of a display device 400 according to the embodiment. FIG. 2A shows a cross section taken along a line A-A of the display device 400 in FIG. 1, that is, a cross section of a first region to be described later, and FIG. 2B shows a cross section taken along a line B-B of the display device 400, that is, a cross section of a second region to be described later.

As shown in FIG. 1, the display device 400 has one major surface. The one major surface of the display device 400 has a first region 310 provided in its central portion and a second region 320 surrounding the first region 310. The end side of the first region 310 is defined to be provided inner than the end side of the one major surface of the display device 400. In FIG. 1, a boundary between the first region 310 and the second region 320 is shown by using a broken line.

In the first region 310, a display layer 311 and a pixel circuit section 312 are provided. The display layer 311, for example, is a liquid crystal layer, an organic electroluminescent layer (OLEDE layer), etc. In at least a part of the second region, a peripheral circuit section 321 and a mounting section 322 (shown in FIG. 4C to FIG. 4D) are provided. The peripheral circuit section 321 is a circuit for driving the display layer 311. Furthermore, the mounting section 322 is a portion to which a relay substrate connectable to the display device is connected.

Here, the display section 400 is an active matrix-type display device. As shown in FIG. 2A, in the first region 310, a film substrate 110, a TFT (thin film transistor) 310T for the pixel formed on the film substrate 110, and the display layer 311 provided via a passivation film 180 and a color filter 190 on the TFT 310T for the pixel are provided. A TFT 310T for the pixel is a part of the pixel circuit section 312, and functions as a switching element for driving the display layer 311.

As the display layer 311, an organic electroluminescent layer is used here. A deflecting plate 100 is provided on a major surface opposite to the major surface facing the display layer 311 of the film substrate 110. An undercoat layer 120 is provided between the film layer 110 and a TFT 311 for the pixel. A sealing film 240 for preventing moisture, etc. from penetrating the display layer 311 is provided on the display layer 311. A barrier film 260 is provided via an adhesion layer 250 on the sealing film 240. The barrier film 260 prevents moisture, etc. from penetrating the display layer 311, and at the same time, has a function as a support member.

The TFT310T for the pixel makes use of a bottom gate-type thin film transistor here, which includes: a gate electrode 130 provided on a part of the undercoat layer 120; a gate insulating film 140 covering the gate electrode 130; a semiconductor layer 150 facing the gate electrode 130 via the gate insulating film 140; a channel protection film 160 provided on a part of the semiconductor layer 150; and a source electrode 170S and a drain electrode 170D that are connected to the semiconductor layer 150 composed of the channel protection film 160. As the semiconductor layer 150, an oxide semiconductor and a silicon semiconductor can be used. As the oxide semiconductor, for example, indium (In), gallium (Ga), and an oxide including zinc (Zn) can be used. Specifically, as the oxide semiconductor, an indium gallium zinc oxide can be used. The TFT310T for the pixel forms the pixel circuit section 310 together with unillustrated signal line and scanning line.

The passivation film 180 is formed of an insulating material. The color filter 190 transmits a light of a specific wavelength and, for example, has a portion transmitting a red light, a portion transmitting a green light, and a portion transmitting a blue light. The passivation film 180 and the color filter 190 are provided with openings covering a part of the drain electrode 170D.

The display layer 311 includes: a anode 200 provided on the color filter 190; a bank 210 provided on the anode 200; a light emitting layer 220 provided on the bank 210; and a cathode 230 provided on the light emitting layer 220. The anode 200 is connected to the drain electrode 170D via the openings of the passivation film 180 and the color filter 190. The bank 210 is at least provided on the TFT310T for the pixel, and has an opening on one part thereof. The light emitting layer 220 and the cathode 230 are provided on the bank 210 and the anode 200 which is exposed from the bank 210. The light emitting layer 220 contacts the anode 200 via the opening of the bank 210. That is, the anode 200, the light emitting layer 220, and the cathode 230 are stacked in the opening of the bank 210. When voltage is applied to the display layer 311, light is emitted from the organic electroluminescent layer.

The second region 320 includes a film substrate 110 and a TFT320T for a peripheral circuit provided on the film substrate 110. The passivation film 180 is provided on the TFT320T for the peripheral circuit. The TFT320T for the peripheral circuit forms the peripheral circuit section 322 together with an unillustrated signal line and scanning line.

The TFT320T for the peripheral circuit is a bottom gate-type thin film transistor here, and includes: the gate electrode 130 provided on a part of the undercoat layer 120; the gate insulating film 140 covering the gate electrode 130; the semiconductor layer 150 facing the gate electrode 130 via the gate insulating film 140; the channel protection layer 160 provided on a part of the semiconductor layer 150; and a source electrode 170S and the source electrode 170S and the drain electrode 170D connected to the semiconductor layer 150 from the channel protection layer 160. The TFT320 for the peripheral circuit forms a driving circuit together with an unillustrated wiring. As an oxide semiconductor, for example, an oxide containing indium (In), gallium (Ga), and zinc (Zn) such as an amorphous indium gallium zinc oxide (a-IGZO) can be used.

Although as the display device 400, an active matrix type can be used, a passive-type display device can also be used. Furthermore, although as the TFT310T for the pixel and the TFT320T for the peripheral circuit, a bottom gate type can be used, a top gate type can also be used.

In FIGS. 2A and 2B, although the configuration of a top gate type is illustrated as the TFT310T for the pixel and the TFT320T for the peripheral circuit, the configuration of a bottom gate type can also be used. The color filter 190 is provided as necessary.

As the film layer 110, polyimide resin is used. Since the film layer 110 using polyimide has heat resistance and a coefficient of linear thermal expansion is small, dimensional changes caused by heating is hard to be generated. As a polyimide resin, polymer having an imide group in its structure such as polyamide imide, polybenzimidazole, polyimide ester, polyether imide, polysiloxane imide, etc. can be included. Polyimide resin can be formed in such a manner that diamine is caused to react with acid anhydride in the presence of a solvent so as to generate a polyamic acid polymer, and the polyamic acid polymer is subjected to ring closure through dehydration (imidization).

As the undercoat layer 120, the gate insulating film 140, and the channel protection layer 160, an insulating material can be used, and for example, oxide silicon, nitride silicon, etc. can be used.

As the gate electrode 130, the source electrode 170S, and the drain electrode 170D, a conductive metal can be used. For example, as the gate electrode 130, a high melting point metal such as molybdenum tungsten (MoW), molybdenum tantalum (MoTa), and tungsten (W) can be used. For example, as a source electrode 140S and a drain electrode 140D, a conductive material can be used. For example, laminated films of titanium (Ti)/aluminum (Al)/titanium (Ti) and molybdenum (Mo)/aluminum (Al)/molybdenum (Mo), and indium tungsten oxide (ITO), etc. can be used.

As the passivation film 180, an insulating material can be used. For example, oxide silicon, nitride silicon, tetraethoxysilane, etc. can be used.

As the color filter 190, a material that transmits a light of the predetermined wavelength can be used, and for example, a pigment which transmits each of red, green, blue colors, and absorbs visible light of other colors can used.

As the cathode 200, a conductive material can be used, and for example, a metal such as indium tin oxide (ITO), etc. can be used. As the bank 210, an insulating material can be used, and for example, a resin material such as a photosensitive acryl resin, etc. can be used. As the light emitting layer 220, a material which disperses a light emitting material that emits the same color as the light transmitted by the color filter 190 of a lower layer into a host material can be used. Alternatively, a host material including a light emitting material emitting a light of red color, a light emitting material emitting a light of green color, and a light emitting material emitting a light of blue color can be used.

As the anode 230, a light-permeable and electrically conductive material can be used, and for example, a metal such as aluminum (Al) can be used.

As the sealing film 240, a light-permeable and insulating material can be used, and for example, an oxide such as a silicon oxide and an aluminum oxide, a nitride such as a silicon nitride, an organic film such as parylene, and stacked films of these elements can be used. As the adhesion layer 250, a light-permeable material can be used, and for example, a thermosetting resin and a photo-curable resin can be used. As the barrier film 260, the light-permeable material can be used, and for example, a material, etc. that coat a plastic base material with a sealing film material can be used.

A support substrate 90 to be described later has strength capable of supporting the film layer 110 when the pixel circuit section 312 and the peripheral circuit section 321, and the display layer 311 and the mounting section 322 are formed, and has heat resistance above that of the film layer 110. The support substrate 90 is preferably transparent. As the support substrate 90, for example, a glass substrate can be used.

Since the film layer 110 is low in heat resistance, the display device using the film layer 110 needs to be fabricated in low temperature. The thin film transistor using the oxide semiconductor can exhibit sufficient characteristics even if fabricated in low temperature. Particularly, the IGZO is an amorphous film, in which driving current is high, and variation between the elements is small, and characteristics between the elements can be equalized, and moreover, mobility is relatively high.

Since the organic electroluminescent layer is high in contrast, and has a property well visible from an oblique direction, it can be used for the display layer 311 of the display device capable of a curve-face display.

FIG. 3A to FIG. 3C and FIG. 4A to FIG. 4D show a cross-sectional view showing a manufacturing process of the display device according to the embodiment. FIG. 5A to FIG. 5C show a plan view showing the manufacturing process of the display device according to the embodiment. Each process of the manufacturing method shown in FIGS. 5A to 5C corresponds to each process of the manufacturing method shown in FIGS. 4A to 4C.

In the embodiment, the film layer 110 is formed on the support substrate 90, and the pixel circuit section 312, the peripheral circuit section 321, the display layer 311, and the mounting section 322 are formed on the film layer 110, and then, the film layer 110 is peeled off from the support substrate 90, thereby manufacturing a display device 400 capable of display a curved face.

Figure 3A:
FIG. 3A to FIG. 3C are cross-sectional views showing a manufacturing process of the display device according to the embodiment.

First, a process of forming the film layer 110 on the support substrate 90 as shown in FIG. 3A will be described. In the embodiment, as the material of the film layer 110, polyimide is used.

Figure 3B:
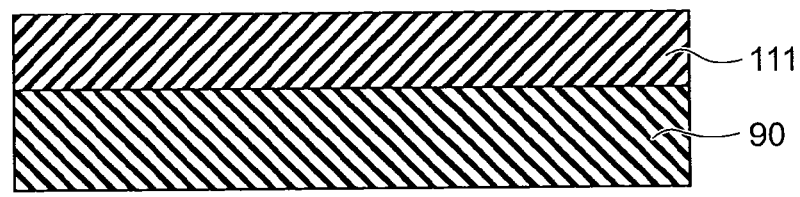

A polyamic acid solution is coated on the support substrate 90 as a film material layer 111, and then, the support substrate 90 is dried, and the film material layer 111 is formed (FIG. 3B).

Figure 3C:
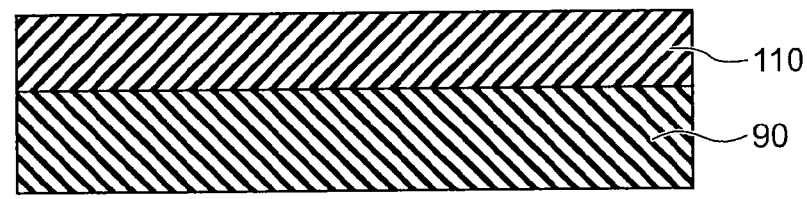

Subjecting the film material layer 111 to heat treatment makes polyamide acid imidized, and the film layer 110 composed of polyimide is formed on the support substrate 90 (first heating process, FIG. 3C).

As the heat treatment, a heating method using, for example, lamp annealing, a hot plate, an oven, etc. can be used.

The temperature of the film material layer 111 in the first heating process is set to T1. T1 may be a temperature exceeding the temperature at which the film material layer can be set to the film layer 110. For example, T1 can be set at 200° C. or more to 500° C. or less. The applying of heat in the range of 200° C. or more to 500° C. or less to the film material layer 111 can form the film layer 110 made of polyimide resin.

The support substrate 90 has a function as a support body when the film material layer 111 is formed.

Figure 4A:
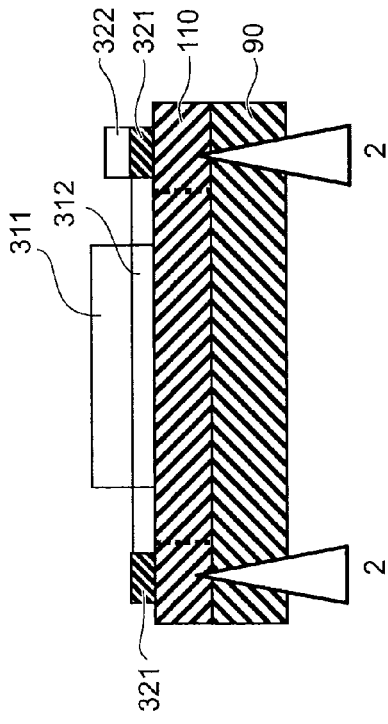
FIG. 4A to FIG. 4D are cross-sectional views showing a manufacturing process of the display device according to the embodiment.
Figure 5A:
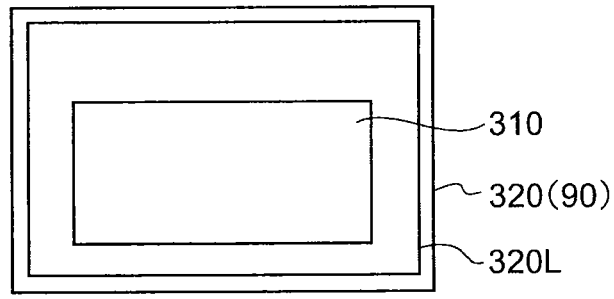
FIG. 5A to FIG. 5C are cross-sectional views showing a manufacturing process of the display device according to the embodiment.
Figure 5B:
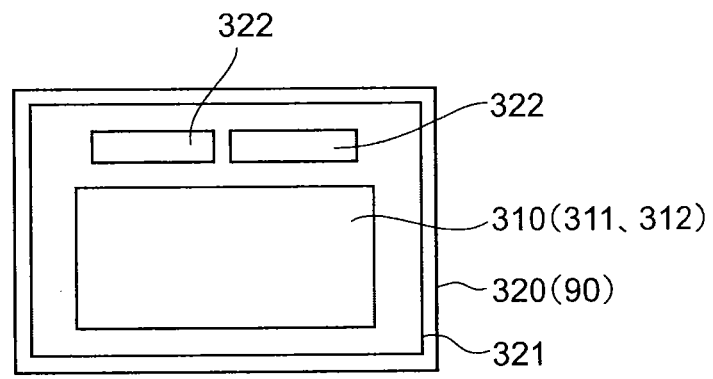
Figure 5C:
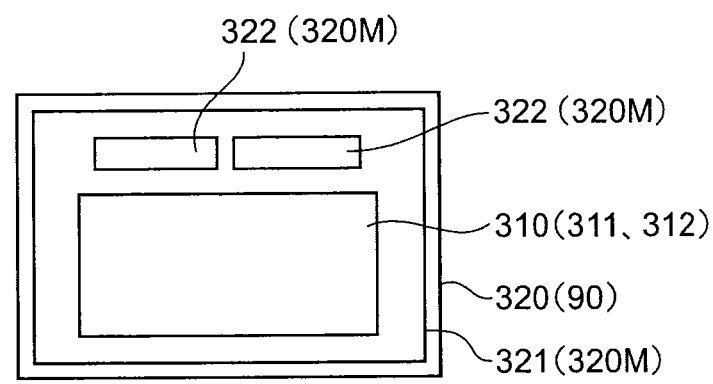

Next, at least a part of the second region 320 which surrounds the first region 310 provided in the central part of the film layer 110 is heated at the temperature higher than that of the first heating process (second heating process, FIG. 4A and FIG. 5A). In the first region 310, the pixel circuit section 312 and the display layer 311 are later formed. In the second region 320, the peripheral circuit section 321 and the mounting section 322 are later formed. As a heating method in the second heating process, there are provided a method for irradiating the film layer 110 with, for example, visible light, infrared rays, ultraviolet rays, microwave, millimeter wave, electron beam, and radioactive rays, and a method for irradiating the same with Joule heat. For example, there is a method for irradiating the film layer 110 with a laser and heating the same with a halogen lamp. FIG. 4A shows a case where the film layer 110 is irradiated with laser 1.

When the laser irradiation is performed as the second heating process, for example, a solid laser using crystals indicated by YAG, YVO$_4$, YLF, and YAlO$_3$ doped with Nd, Tm, and Ho, an excimer laser, a CO$_2$ laser, an argon laser or a semiconductor laser can be used. For example, a xenon chloride (XeCl) excimer laser can be used.

The temperature of the film layer 110 in the second heating process is made higher than the temperature of the film layer 110 in the first hearing process. The temperature of the film layer 110 in the second heating process is set to T2. There is a relation of T1<T2 between T1 and T2. Specifically, when the laser is used for the second heating process, T2 can be adjusted by conditions such as a wavelength of laser, a pulse width, a frequency, etc. at the time of the repeated laser irradiation. For example, the first heating process is performed by a hot plate and an oven so as to set T1 as 350° C. When a XeCl excimer laser is used for the second heating process having energy of laser set to 160 mJ/cm$^2$, a central wavelength set to 308 nm, a repetition frequency set to 300 Hz, and a pulse width set to 29 nanoseconds, T2 can be set to not less than 1000° C.

By the second heating process, adhesiveness between the support substrate 90 and the film layer 110 in a heated portion 320L is increased. In a portion not heated by the second hearing process, an adhesive force between the support substrate 90 and the film layer 110 is kept as it is.

Figure 4B:
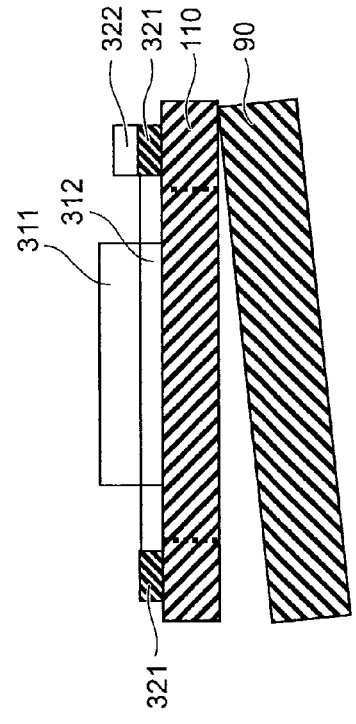

Subsequently, the pixel circuit section 312 is formed in the first region 310 which is on the film layer 110, and the peripheral circuit section 321 is formed in the second region. Then, the display layer 311 is formed in the first region 310, and the mounting section 322 is provided in the second region (FIG. 4B and FIG. 5B).

Figure 4C:
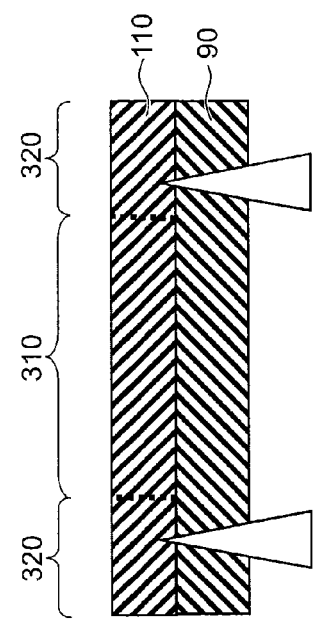

In the second region 320, at least a part of the range heated by the second heating process is heated (third heating process, FIG. 4C and FIG. 5C). The temperature of the film layer 110 in the third heating process is made higher than the temperature of the film layer 110 in the second heating process. The temperature of the film layer 110 in the third heating process is set to T3. There is a relation of T2<T3 between T2 and T3. As a heating method in the third heating process, there are provided a method for irradiating the film layer 110 with, for example, visible light, infrared rays, ultraviolet rays, microwave, millimeter wave, electron beam, and radioactive rays, and a method for irradiating the same with Joule heat. For example, there is a method for irradiating the film layer 110 with the laser and heating the same with a halogen lamp.

FIG. 4C shows a case where the film layer 110 is irradiated with laser 2. When the laser irradiation is performed as the third heating process, for example, a solid laser using crystals indicated by YAG, YVO$_4$, YLF, and YAlO$_3$ doped with Nd, Tm, and Ho, an excimer laser, a CO$_2$ laser, an argon laser or a semiconductor laser can be used. When the laser is used for the third heating process, T3 can be adjusted by conditions such as a wavelength of laser, a pulse width, a frequency, etc. at the time of the repeated laser irradiation. For example, xenon chloride (XeCl) excimer laser can be used. When the XeCl excimer laser is used, energy of the laser can be set to 180 mJ/cm$^2$, a central wavelength can be set to 308 nm, a repetition frequency can be set to 300 Hz, and a pulse width can be set to 29 nanoseconds.

Here, a portion 320M heated by the third heating process is defined as a portion provided with the peripheral circuit section 321 and the mounting section 322. The portion 320M heated by the third heating process may be wider or narrower than the portion 320L heated by the second heating process.

Figure 4D:
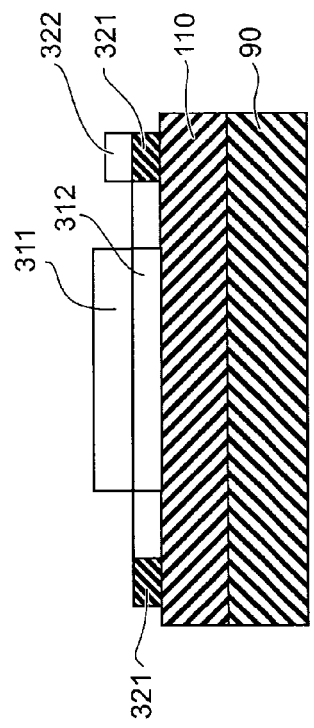

Since high energy is applied to the support substrate 90 and the film layer 110 by the third heating process, the film layer 110 can be peeled off from the support substrate 90. For example, when the third heating process is performed by laser irradiation the film layer 110 of the portions having been irradiated are peeled off from the support substrate 90 of the portions having been irradiated by being irradiated with the laser 2 from the support substrate 90 side. The third heating process includes forming an airspace in at least a portion between the support substrate 90 and the film layer 110. With respect to a portion other than the portions having been irradiated with the laser, the film layer 110 is mechanically peeled off from the support substrate 90 (FIG. 4D).

To mechanically peel off the film layer 110 from the support substrate 90, for example, a peel-off device, etc. can be employed.

With the temperature of the second region 320 of the film layer 110 selectively increased by the second heating process, the adhesive force between the film layer 110 and the support substrate 90 can be increased. Although several models for increasing the adhesive force can be considered, it is expected that the increase of the temperature of the film layer 110 further advances the imidization inside the film layer 110 and the effect of passing the moisture thus generated to the support substrate 90 side further increases the adhesive force.

When at least a part of the adhesive force of the second region 320 is increased, and the pixel circuit section 312, the peripheral circuit section 320, the display layer 311, and the mounting section 322 are formed later on, the film layer 100 is hardly peeled off from the support substrate 90. Consequently, the pixel circuit section 312, the peripheral circuit section 321, the display layer 311, and the mounting section 322 are easily formed on the film layer 110, and as a result, a manufacturing yield of the display device 400 can be improved. Since heat is applied when the pixel circuit section 312, the peripheral circuit section 321, the display layer 311, and the mounting section 322 are formed on the film layer 110, there is a possibility of change in the dimension of the film layer 110 when the film layer 110 is peeled off from the support substrate 90.

To form the pixel circuit section 312, the peripheral circuit section 321, the display layer 311, and the mounting section 322 on the film layer 110, the same method as that of the processing on the existing glass substrate can be employed. That is, these sections and the display layer can be formed on the film layer 110 similarly to the forming of an active matrix system display device on the glass substrate.

In the second heating process, with respect to the portion in which the adhesive force between the support substrate 90 and the film layer 110 is improved, if an attempt is made to mechanically peel off the film layer 110 from the support substrate 90, peeing-off failures such as creases, elongation, tears, etc. are generated in the film layer 110. By being irradiated with the laser at this portion, the film layer 110 is caused to float from the support substrate 90, thereby allowing the film layer 110 to be peeled off from the support substrate 90. Energy of the laser may be set above the extent that the film layer 110 is caused to float from the support substrate 90.

Since the mounting section is provided by pressure bonding in a state in which the temperature is applied, there are some cases where the adhesive force between the film layer 110 and the support substrate 90 is further increased, thereby making it difficult to peel off the film layer 110 from the support substrate 90. Consequently, though a part or the whole of the second region 320 may be irradiated with the laser in order to peel off the film layer 110 from the support substrate 90, particularly it is preferable to irradiate a portion in which the mounting section 322 is provided, with the laser.

The pixel circuit section 312 and the display layer 311 of the first region 310 are likely to cause characteristic variations due to laser irradiation. Particularly, when the oxide semiconductor is used for the TFT310T for the pixel provided in the pixel circuit section 312 and the organic electroluminescent layer 220 is used as the display layer 311, a display quality of the display device 400 is likely to become poor as a result of heating and energy applied by the laser. However, according to the embodiment, in the first region 310, since the second process is not performed so that the adhesive force between the support substrate 90 and the film layer 110 is not increased, the film layer 110 can be peeled off from the support substrate 90 not by laser irradiation but by mechanical peel-off.

The moisture permeability of the support substrate 90 affects the separability between the support substrate 90 and the film layer 110. An organic solvent contained in the film material layer 111 concentrates on an interface between the support substrate 90 and the film layer 110 at the time of drying and imidizing the film material layer 111. Further, water molecules generated by imidization concentrates on the interface between the support substrate 90 and the polyimide film layer 110. Thereby, the adhesion between the support substrate 90 and the film layer 110 is inhibited. Consequently, when the pixel circuit section 312, the peripheral circuit section 321, the display layer 311, and the mounting section 322 are formed later on the film layer 110, the film layer 110 may be easily peeled off from the support substrate 90.

Here, if the moisture permeability of the support substrate 90 is great, water molecules and organic solvent present in the interface between the support substrate 90 and the film layer 110 are passed outside, and thus the adhesiveness between the support substrate 90 and the film layer 110 can be increased. However, if the adhesiveness is too high, when the film layer 110 is peeled off from the support substrate 90 after the pixel circuit section 312, the peripheral circuit section 321, the display layer 311, and the mounting section 322 are formed on the film layer 110, the peel-off becomes difficult. In contrast, if the moisture permeability of the support substrate 90 is small, water molecules and organic solvent remain in the interface between the support substrate 90 and the film layer 110, and thus the film layer 110 is likely to float from the support substrate 90 when the pixel circuit section 312, the peripheral circuit section 321, the display layer 311, and the mounting section 322 are formed on the film layer 110. Consequently, the adhesiveness between the support substrate 90 and the film layer 110 can be adjusted depending on the moisture permeability of the support substrate 90.

Furthermore, since polyimide used for the film layer 110 has a certain degree of moisture permeability, there is a possibility of changes with the lapse of time in the moisture content of the interface between the support substrate 90 and the film layer 110. Moreover, since the moisture content of the interface is changed by external factor such as surface free energy between the support substrate 90 and the film layer 110, an environmental temperature, and an environmental humidity, it is difficult to control the moisture content of the interface, and the peeling of the film layer 110 from the support substrate 90 with a fixed strength is difficult. Thus, it is difficult to control the separability (or adhesiveness) between the film layer 110 and the support substrate 90.

However, according to the embodiment, since the adhesiveness of the first region 310 and the second region 320 can be changed, the peel-off of the film layer 110 from the support substrate 90 can be performed with a fixed strength regardless of the display device, and this leads to an excellent mass-productivity.

Particularly, if a portion heated by the second heating process has a shape of surrounding the first region 310, the adhesiveness of the peripheral portion of the first region 310 is increased. Consequently, in a wet process for forming the pixel circuit section 312, the peripheral circuit section 321, the display layer 311, and the mounting section 322, a possibility of a liquid and a gas contained in an environmental atmosphere entering between the support substrate 90 and the film layer 110 can be reduced, and the moisture content between the support substrate 90 and the film layer 110 is difficult to change. As a shape of surrounding the first region 310, the shape can be frame-like if the first region 310 is approximately oblong, and can be ring-like if the first region 310 is approximately circular.

As described above, according to the embodiment, when the pixel circuit section 312, the peripheral circuit section 321, the display layer 311, and the mounting section 322 are formed on the film layer 110, the film layer 110 is difficult to be peeled off from the support substrate 90 each other, and after forming the pixel circuit section 312, the peripheral circuit section 321, the display layer 311, and the mounting section 322 on the film layer 110, a display device capable of easily peeling off the film layer 110 from the support substrate 90 and the method for manufacturing the display device can be provided.

EXAMPLE

Since the evaluation of the adhesiveness between the support substrate and the film layer by the second heating process has been conducted, it will be described as follows. As an upper support substrate, a PEN substrate was pasted on a polyimide film (10 μm) coated and formed on a glass substrate (film thickness: 700 μm), and an evaluation was conducted on the adhesiveness by laser irradiation and a state of polyimide. As a laser, the XeCl excimer laser (central wavelength: 308 nm) was used, and a polyimide interface was irradiated with the laser via the glass substrate. The XeCl laser was pulsed, and the beam was formed into be a line shape 200 mm×0.4 mm.

Figure 6:
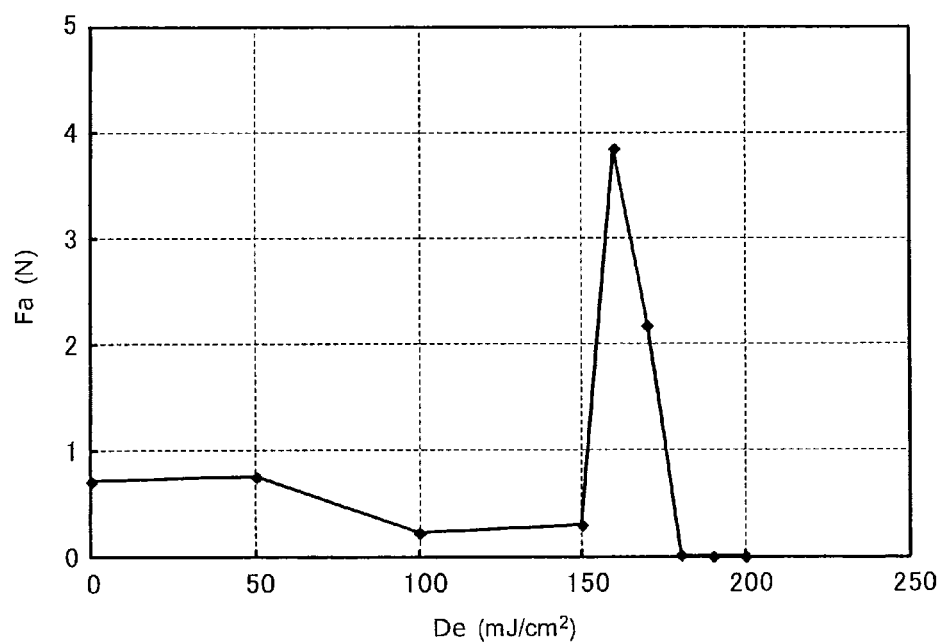
FIG. 6 is a view showing the relationship between an energetic density of the laser and a load.

FIG. 6 shows a view illustrating the relationship between an energetic density De of the laser when using the laser irradiation as the second heating process and a load Fa required for peeling off the film layer from the support substrate. The energy density De of the laser is represented on the vertical axis, and a load Fa required for peeling off the film layer from the support substrate is represented on the horizontal axis.

As a result of performing the laser irradiation with the energetic density De of the laser in the range of 100 mJ/cm$^2$ to 300 mJ/cm$^2$, it was confirmed that a space is produced between the polyimide film and the glass substrate in the range of not less than 180 mJ/cm$^2$. Consequently, when the energetic density De of the laser is increased to not less than 180 mJ/cm$^2$, it was found that polyimide is floated. Furthermore, in the density of 160 mJ/cm$^2$, although there was no variation in appearance in the polyimide layer itself, as a result of performing a peeling test, the adhesiveness thereof was substantially increased, and in the region having less than the energetic density De, it was found that there is neither variation in appearance nor any change in peeling strength.

Although the adhesiveness was illustrated, it is found that the adhesiveness is increased immediately before polyimide is floated. This represents T2>T1, and is expected to be a result of the advancement of the imidization of the film layer. That is, the adhesiveness between the film layer and the support substrate is increased by performing the second heating process giving the energy higher than the energy of the first heating process.

Figure 7:
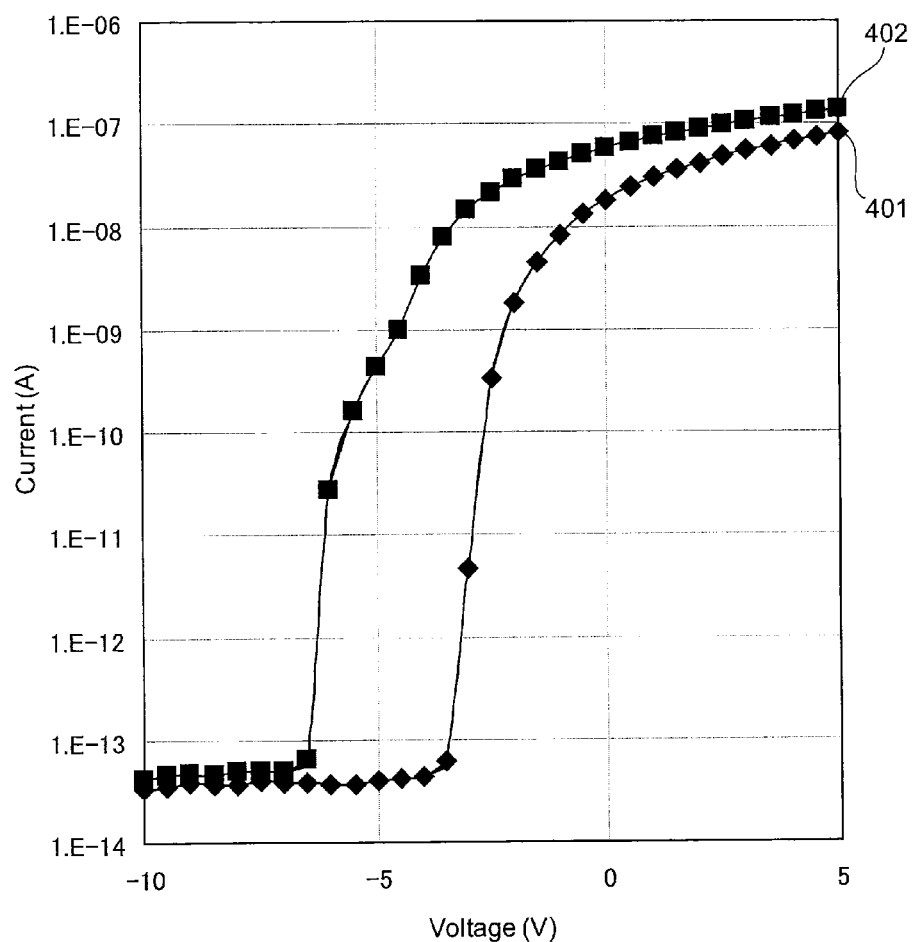
FIG. 7 is a view showing current-voltage characteristics of the TFT before and after irradiating with an ultraviolet light.

Furthermore, with respect to this display device, current-voltage characteristics of the TFT for the pixel in a curved line 401 before and a curved line 402 after irradiating the first region with an ultraviolet (UV) light are shown in FIG. 7. The horizontal axis of FIG. 7 represents a gate voltage, and the vertical axis represents a drain current. When the first region is irradiated with the ultraviolet light, the current-voltage characteristics of the TFT for the pixel are shifted to the negative side. That is, when the second heating process and the third heating process are conducted in the first region, the desired characteristics are not obtained for the TFT for the pixel, and the display quality of the display device sometimes becomes poor.

Hereinabove, exemplary embodiments of the invention are described with reference to specific examples. However, the invention is not limited to these specific examples. For example, one skilled in the art may similarly practice the invention by appropriately selecting specific configurations from known art. Such practice is included in the scope of the invention to the extent that similar effects of the invention are obtained.

Further, any two or more components of the specific examples may be combined within the extent of technical feasibility and are included in the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a display device comprising:
   a first heating for heating a second region surrounding a first region at a first heating temperature, the first region being provided in a central part of a film layer, the film layer being provided on a substrate;
   forming a display layer in a part of the first region and forming a peripheral circuit section at least in a part of the second region;
   a second heating for heating at least a part of the film layer other than in a range in which the display layer is formed, at a second heating temperature higher than the first heating temperature, the second heating causing to decrease an adhesive force between the at least a part of the film layer and the substrate;

forming a film material layer on the support substrate, the film material layer being formed to serve as the film layer; and a third heating for heating the film material layer at a third heating temperature lower than the first heating temperature to form the film layer from the film material layer.

2. The method according to claim 1, wherein the first heating is performed by irradiating the film layer with a laser or by heating the film layer with a halogen lamp.

3. The method according to claim 2, wherein the second heating is performed by irradiating the film layer with the laser or by heating the film layer with the halogen lamp.

4. The method according to claim 1, further comprising peeling off the film layer from the substrate after the second heating.

* * * * *